US005548224A

United States Patent [19]
Gabriel et al.

[11] Patent Number: 5,548,224
[45] Date of Patent: Aug. 20, 1996

[54] METHOD AND APPARATUS FOR WAFER LEVEL PREDICTION OF THIN OXIDE RELIABILITY

[75] Inventors: Calvin T. Gabriel, Cupertino; Subhash R. Nariani, San Jose, both of Calif.

[73] Assignee: VLSI Technology, Inc, San Jose, Calif.

[21] Appl. No.: 376,590

[22] Filed: Jan. 20, 1995

[51] Int. Cl.$^6$ ............................ G01R 31/26; H01L 21/66
[52] U.S. Cl. .................. 324/765; 324/769; 437/8
[58] Field of Search ............................ 324/765, 766, 324/769, 719; 437/8; 257/48

[56] References Cited

U.S. PATENT DOCUMENTS

| | | | |
|---|---|---|---|
| 3,465,427 | 9/1969 | Barson et al. | 437/8 |
| 4,542,340 | 9/1985 | Chakravarti et al. | 324/769 |
| 4,638,341 | 1/1987 | Baier et al. | |
| 4,672,314 | 6/1987 | Kokkas | 324/765 |
| 4,789,825 | 12/1988 | Carelli et al. | 324/765 |
| 4,860,079 | 8/1989 | Turner | |
| 4,896,108 | 1/1990 | Lynch et al. | |
| 4,906,921 | 3/1990 | Juge | 324/766 |
| 4,994,736 | 2/1991 | Davis et al. | 324/765 |
| 5,239,270 | 8/1993 | Desbiens | 324/769 |
| 5,304,925 | 4/1994 | Ebina | 324/769 |
| 5,391,502 | 2/1995 | Wei | |

OTHER PUBLICATIONS

"How Plasma Etching Damages Thin Gate Oxides," Calvin T. Gabriel, VLSI Technology, Inc. and James P. McVittie, Stanford Univ., Jun. 1992, *Solid State Technogy*. p. 81–87.

*Primary Examiner*—Ernest F. Karlsen
*Attorney, Agent, or Firm*—Flehr, Hohbach, Test, Albritton & Herbert

[57] ABSTRACT

An IC wafer containing thin oxide is fabricated with at least one pair of antenna structures having identical antenna ratio $A_R$ but different antenna plate areas. Each antenna structure includes connected-together conductive plate regions, one plate formed over thick field oxide and the other plate formed over thin oxide on the IC. Because weak oxide defects occur somewhat uniformly throughout the thin oxide, a larger antenna structure will overlie more weak oxide defects than will a smaller antenna structure. If wafer test leakage current across the larger antenna structure exceeds leakage current across the smaller antenna structure, weak oxide is indicated because the defect is area dependent. By contrast, charge-induced damage is substantially independent of the area of the antenna plates. Because the $A_R$ ratios are constant, charge density is constant in the antenna structure portions overlying the thin oxide. If test leakage current on the wafer is substantially the same for each antenna structure, charge-damaged oxide is indicated because the damage is not area dependent. If desired, test MOS devices may be fabricated whose gates are the plates formed over the thin oxide. Defects in the thin (gate) oxide may be identified by examining the characteristics of the test MOS devices.

20 Claims, 4 Drawing Sheets ic oxide could be identified, one might know to
reexamine the charge-producing portions of the fabrication
process, perhaps with respect to generating a more uniform
plasma field.

Unfortunately, prior art testing techniques cannot readily
differentiate between an IC containing weak oxide and an IC
containing charge-damaged oxide. Such testing is generally
carried out using so-called antenna structures such as shown
in FIG. 1.

METHOD AND APPARATUS FOR WAFER LEVEL PREDICTION OF THIN OXIDE RELIABILITY

FIELD OF THE INVENTION

The invention relates to methods and apparatuses for predicting the reliability of integrated circuits ("ICs"), and more specifically to predicting reliability of ICs containing a thin oxide layer such as associated with a metal-oxide-semiconductor ("MOS") device, an IC capacitor dielectric layer, and the like.

BACKGROUND OF THE INVENTION

Using well known techniques, integrated circuits ("ICs") are fabricated on a wafer substrate by forming various depositions, layer by layer in a production facility that is often termed a "fab". For example, an IC containing metal-oxide-semiconductor ("MOS") devices has a thin layer of oxide over which a layer of conductive gate material (e.g., polysilicon) is formed and then defined. The MOS device source and drain regions are then formed, either by photolithography or by using the defined gates as a self-aligning mask. In some ICs, a capacitor may be formed by forming a layer of conductive material such as polysilicon over a thin layer of oxide. Normal backend processing completes the fabrication of the IC.

The IC is then functionally tested to detect and hopefully screen-out defective units. Understandably, defective units should not be packaged and delivered to customers.

In ICs containing MOS devices or IC capacitors, thin oxide (e.g., thin gate oxide or dielectric oxide) is a substantial factor contributing to IC failure. Two types of defective oxide are generally recognized in the art: weak oxide, and charge-damaged oxide.

Weak oxide is oxide that was formed inherently weak during fabrication, typically due to imperfections in the fabrication process. For example, the wafers may have been cleaned with contaminated wet chemicals, or contamination may be present in the gate oxide tube used during fabrication. In any event, such defects may exist randomly anywhere within the IC structure, and will affect the reliability of every structure formed on the wafer that utilizes thin oxide, e.g., every MOS device, and every capacitor.

By contrast, charge-damaged oxide is oxide that has been subjected to damage when the IC wafer was exposed to an environment with charged, energetic species. Such exposure can occur during such fabrication steps as plasma etching, plasma ashing, plasma deposition, ion implantation, and sputtering.

It is believed that the primary cause of charge-damaged oxide is charging of conductors overlying the oxide, typically due to plasma non-uniformities across the wafer surface. This non-uniformity produces electron currents and ion currents that do not balance locally. The resultant imbalance (e.g., net current flux to the wafer) appears to cause wafer surface charge, with increased voltage across the thin gate or capacitor oxide. The charging continues until the currents become balanced, or the thin oxide becomes damaged and begins to conduct, apparently via Fowler-Nordheim tunneling.

If weak oxide formation could be identified, one might know to reexamine certain portions of the fabrication process, perhaps with respect to removing contamination from the wafer before oxidation. On the other hand, if charge- In FIG. 1, at least in a preliminary state, an IC is formed on a wafer whose semiconductor substrate 10 that includes a layer of thin oxide 20 covered by a preferably polysilicon level 1 conducting region 30, as well as regions of thick field oxide 40. Whereas the thin oxide may be less than perhaps a few 100 Å in thickness, the field oxide may exceed several thousand Å in thickness. A relatively large conductive region 50, also preferably fabricated at the polysilicon 1 level, is formed atop the field oxide 40, and is coupled by a conductive segment 60, e.g., polysilicon, to the smaller conducting region 30 that overlies the thin oxide 20.

The formation of regions 30 and 50 produces two parallel-coupled capacitors C1 and C2 on a region of the IC wafer that is sufficiently large for implementation of capacitor C1. The "plates" of capacitor C1 are the large conductive region 50 and a region of the underlying substrate 10, which regions are separated by the thick field oxide 40. The "plates" of capacitor C2 are the smaller conductive region 30, and a region of the underlying substrate 10, which regions are separated by the thin oxide 20.

The area of conductive region 50 divided by the area of conductive region 30 defines a ratio ($A_R$) for the antenna structure. Thus, if conductive region 30 has an area of perhaps 5 µm$^2$ and conductive region 50 has an area of 50 µm$^2$, the antenna ratio $A_R$ is 10; if conductive region 50 has an area of say 500,000 µm$^2$, $A_R$ is 100,000, and so on.

As shown in FIG. 1, the thin oxide dielectric layer of capacitor C2 is substantially thinner than the field oxide dielectric layer of capacitor C1. As a result, capacitor C2's "plates" are closer together. On one hand, because capacitance is inversely proportional to the separation between the capacitor "plates", capacitor C2 exhibits substantially greater capacitance per unit area than capacitor C1. However, total capacitance for a capacitor is proportional to plate area. Because the plate area ratios may well be in the range of several thousand or more, whereas the ratio between the thick field oxide and the thin oxide may be in the ten to one hundred range, the area effect will tend to dominate the plate separation or thickness effect.

Because the two capacitors are coupled in parallel, C1 and C2 see the same voltage. If a voltage V is induced across the capacitors, e.g., during plasma etching 100, the following equation governs:

$$Q1/C1 = V = Q2/C2$$

Thus, any charge Q resulting from the plasma etching 100 will be shared such that substantially most of the charge will appear across the relatively large capacitance C1 (e.g., assuming that area effect dominates thickness effect), e.g., Q=Q1+Q2, where Q1>>Q2. As such, much of the plasma induced charge Q is collected by conductor region 50. However, any charge Q2 that exists over the thin oxide 20 covered by plate 30 will have the greatest impact due to the thinness of the oxide layer 20. Further, because leakage will occur through the thin oxide layer 20 and not through the thick field oxide 40, charge Q1 associated with capacitor C1 will be drained through capacitor C2 to the underlying substrate 10.

Shown generically in FIG. 1 are two types of oxide damage: weak oxide 110 (shown as circles) and charge-damaged oxide 120 (shown as triangles). These defects behave as if there were a resultant localized thinning of the oxide layer 20. Thus, while the defects are depicted as circles and triangles for ease of illustration, it is to be understood that these symbols do not literally represent the "shape", the "size", or the exact location of the defects.

Within the thin oxide layer 20, charge sharing can occur between regions of the layer having a nominal thickness and regions of the layer that are effectively thinner. The localized capacitance associated with the effectively thinner regions of layer 20 will be greater than the capacitance associated with the nominal thickness of layer 20. Thus, within the capacitor C2 defined over the thin oxide layer 20, there will be regions of higher capacitance associated with thinner regions of the oxide, per unit area. Charge distribution within capacitor C2 will tend to be maximized over the thinned oxide regions that include the defects 110, 120. As a result, the thinner, defect-containing, regions will tend to breakdown first relative to the nominally thick regions of thin oxide layer 20.

As suggested by FIG. 1, the weak oxide defects 110 can be found randomly and perhaps uniformly throughout the thin oxide layer. By contrast, the charge damage to the oxide will tend to occur beneath the conductive region 30, since any charge associated with capacitor C2 appears across a relatively thin oxide region. Any defects in the thick oxide 40 tend to be buried within and cannot appreciably thin or weaken the thick oxide.

Capacitors C1 and C2 may be formed using the same process steps carried out on the remainder of the IC wafer. For example, in subsequent process steps, an inter-layer dielectric may be formed over the polysilicon level 1 regions 30, 50, 60, (and other regions on the wafer). An overlying metal 1 region may then be added, followed by an inter-metal-oxide layer, and then perhaps an overlying metal 2 region, and so on. These additional process steps are not depicted in FIG. 1. However, many of these steps may involve charged energetic species, which can cause substantial charge to be collected in the conductive region 30. As noted, this charge can give rise to charge damage 120 in the underlying thin oxide 30. Because C1 and C2 are used only for testing, they need not be electrically coupled to the remainder of the IC.

Conventional antenna structures such as capacitors C1 and C2 are used in the prior art in an attempt to determine quality of thin oxide layer 20. At the simplest level, oxide testing can include coupling an overvoltage across the thin oxide, and measuring to determine whether any leakage current exceeds a predetermined threshold. For example, current exceeding say 1 nA may indicate either weak oxide, charge-damaged oxide, or both. Failed parts may be subjected to failure analysis to determine the root cause of failure.

Unfortunately, while leakage current measurements can identify a wafer containing weak oxide or charge-damaged oxide, prior art testing cannot readily discriminate between the two types of damage. A part evidencing excessive leakage current will be rejected using prior art techniques, even though the lot may still be usable if the leakage current resulted from charge-damaged rather than from weak oxide. Because it is not readily known whether weak oxide or charge-damaged oxide is at hand, one does not know whether to look for contamination in the fabrication process, or to re-examine the plasma-generating equipment.

It is also known in the art to test completed ICs using a so-called high temperature operation life ("HTOL") test that is performed at elevated temperature and perhaps overvoltage conditions. Industry accepted protocols for HTOL testing may be found in the "MIL_STD_883C Handbook, Method 1005, Steady State Life". HTOL testing measures reliability of actual, completed IC products.

In HTOL testing, completed ICs on the wafer are packaged and then a sample, e.g., perhaps 1,000 parts, is tested to determine oxide reliability. Because what is HTOL-tested are finished parts, no antenna structures will be present. The sample ICs are first tested to ensure that they are functional. If so, the sample parts are mounted on dedicated printed circuit boards that are installed in an oven maintained at a higher temperature, perhaps 125° C. The test parts are then electrically cycled by the application of operating power and test signals. Understandably at high temperature, the degradation mechanisms are accelerated, wherein the acceleration factor is known from prior experiments. To further accelerate testing, over-voltages are coupled to the parts, such that an IC containing 5 V devices will be tested at an operating level of perhaps 5.5 VDC, or higher.

The sample parts are tested for a fixed time, removed (or "pulled") from the oven, cooled, and then re-tested. Any part not passing the test is considered a failure and is removed from the sample, and perhaps subjected to failure analysis.

The remaining parts are subjected to further HTOL cycling. A typical sequence of "pull points" might be after 6, 24, 48, 96, 168, 500 and 1,000 hours of cumulative HTOL testing. At each pull point, about two days of manpower are required to test the parts. Typically, parts failing before 168 hours are termed "infant mortality", while parts surviving beyond 168 hours are used to calculate the expected failure rate in the field.

Unfortunately, prior art HTOL testing is an expensive and time consuming undertaking, as is any accompanying failure analysis. Typically, the results of HTOL testing are not available for 2–3 months after the wafer was fabricated. Thus, prior art testing results in a significant delay before reliability information for a particular lot of wafers is available. In the interim, the fab that produced the sample lot may still be producing ICs with defective oxides, perhaps by using a contaminated diffusion tube or unbalanced plasma-generating equipment. Further, HTOL results are applicable primarily to the lot from which the samples were prepared. However defective oxide may vary from wafer to wafer, and from lot to lot. Thus, one lot tested for HTOL may have reliable oxide, whereas the next lot may not, or vice versa.

What is needed is a rapid and inexpensive way to test thin oxides, preferably at the wafer level before packaging. Such testing should require less than perhaps an hour per test lot, and should readily discern between weak oxide and charge-damaged oxide. Finally, such testing should be carried out using test structures and equipment that are not dedicated to the particular type of IC product being tested.

The present invention provides such a method and testing apparatus.

SUMMARY OF THE INVENTION

Integrated circuits containing MOS devices or IC capacitors have a thin oxide whose oxide quality can determine reliability and yield of the MOS devices or capacitors. Applicants have discovered that there is no significant degradation in the reliability of oxide that has been exposed to charging, providing the oxide itself was not weak to begin with. Thus, wafers containing charge-damaged oxide may be used to fabricate MOS devices and/or capacitors, providing that the MOS gate or capacitor "plate" is not coupled to a relatively large or long conductive lead that may act as an antenna.

To discern charge-damaged oxide from weak oxide, the present invention provides each wafer with at least one pair of differentiating antenna structures. The structures have an identical antenna ratio $A_R$ but have different antenna plate areas. Thus, although one antenna structure is "large" and the other antenna structure is "small", each structure has the same ratio, e.g., $A_R = A_{Rlarge} = A_{Rsmall}$. Each antenna structure includes coupled-together conductive plate regions of polysilicon, polycide, or the like. One plate is formed over thick field oxide and the other plate is formed over thin oxide on the IC.

Weak oxide may be characterized by defects that occur randomly and somewhat uniformly throughout the thin oxide. Thus, the region of the larger antenna structure formed over the thin oxide will overlie more weak oxide defects than will the corresponding portion of the smaller antenna structure. If wafer test leakage current across the larger antenna structure exceeds leakage current across the smaller antenna structure, weak oxide is indicated because the oxide defect is area dependent. Thus, the wafer under test should not be used, and the fab should be examined with respect to contamination and the like that gave rise to the weak oxide.

By contrast, charge-induced damage will be substantially independent of the area ratio of the antenna plates. Because $A_{Rlarge} \approx A_{Rsmall}$, the charge per unit capacitor "plate" area associated with the thin oxide is substantially constant. As a result, if test leakage current on the wafer is substantially the same across each antenna structure, charge-damaged oxide is indicated because the damage is not area dependent. The wafer under test may still be used, providing that the completed IC does not include a large antenna-like structure over the thin oxide. Further, it is also known that the fab should be re-examined with respect to possible imbalances in the plasma-generating or other energetic species generating equipment.

If desired, source and drain regions may be formed adjacent the small capacitor plate region to define a MOS device whose gate is the small plate and whose gate oxide is the thin oxide. So doing would permit testing MOS device parameters to discern the state of the gate oxide, rather than solely testing for leakage current through the gate oxide.

Even if the wafer were never subjected to a field-induced charge during fabrication (e.g., if no plasma-type process steps were involved, or in only perfect plasma generators were used), the present invention could still discern area-dependent weak oxide from any charge-damaged oxide.

Other features and advantages of the invention will appear from the following description in which the preferred embodiments have been set forth in detail, in conjunction with the accompanying drawings.

DETAILED DESCRIPTION OF THE PREFERRED EMBODIMENT

Applicants have discovered that there is no significant degradation in the reliability of oxide that has been exposed to charging, providing the oxide itself was not weak to begin with. Thus, wafers containing charge-damaged oxide may be used to fabricate MOS devices and/or capacitors, providing that the MOS gate or the capacitor "plate" is not coupled to a relatively large or long conductive lead that may act as an antenna. With this limitation, the resultant MOS devices and capacitors can still have acceptable device yield and reliability.

Thus, in functionally testing ICs, it is important to learn whether the oxide on a given wafer was defective to begin with (e.g., weak oxide), or whether subsequent wafer processing produced charge damage. A wafer containing weak oxide should not be used to form ICs, whereas a wafer containing charge-damaged oxide may safely be used to form ICs, with certain exceptions explained later herein. As will now be described, the present invention permits discerning weak oxide from charge-damaged oxide.

Figure 1:
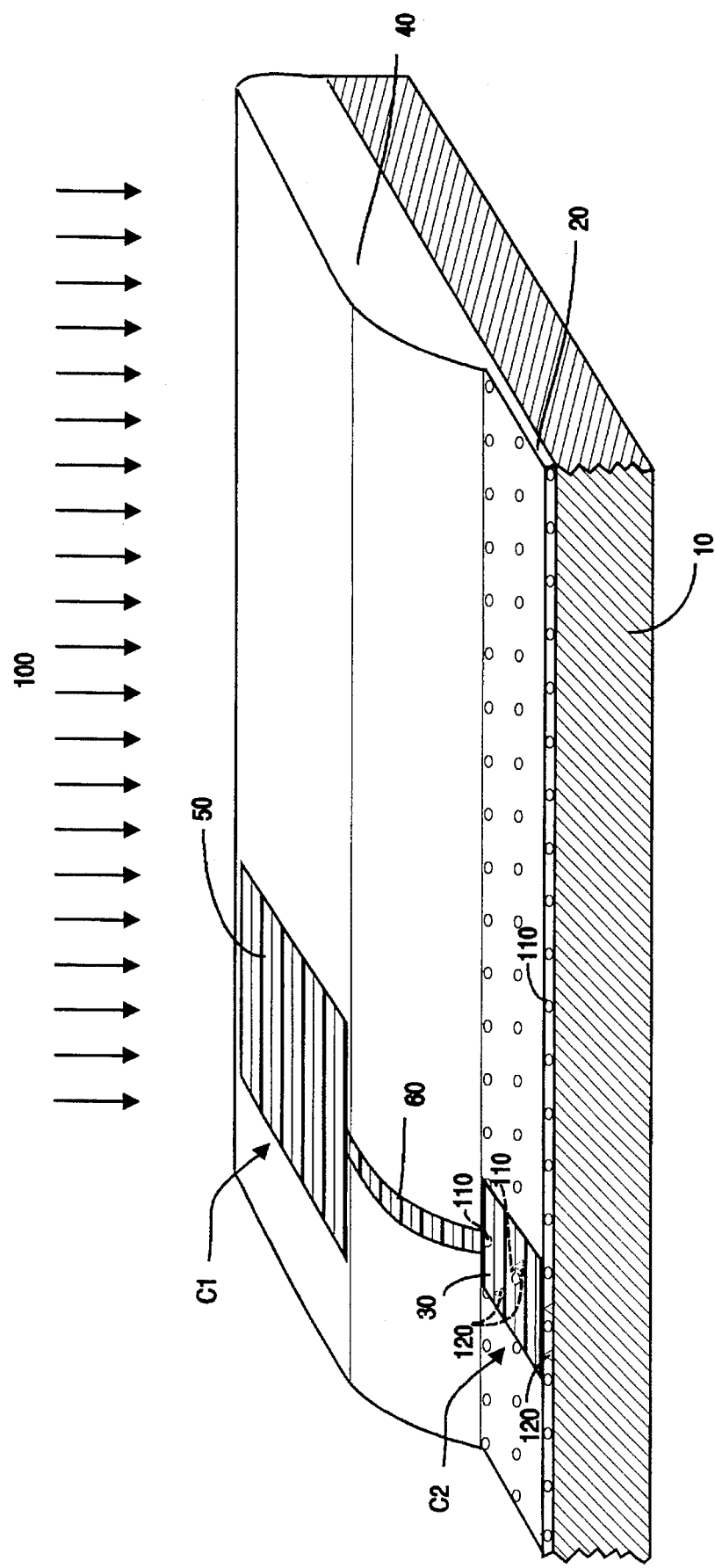
FIG. 1 depicts an antenna structure for testing thin oxide, according to the prior art.
Figure 2:
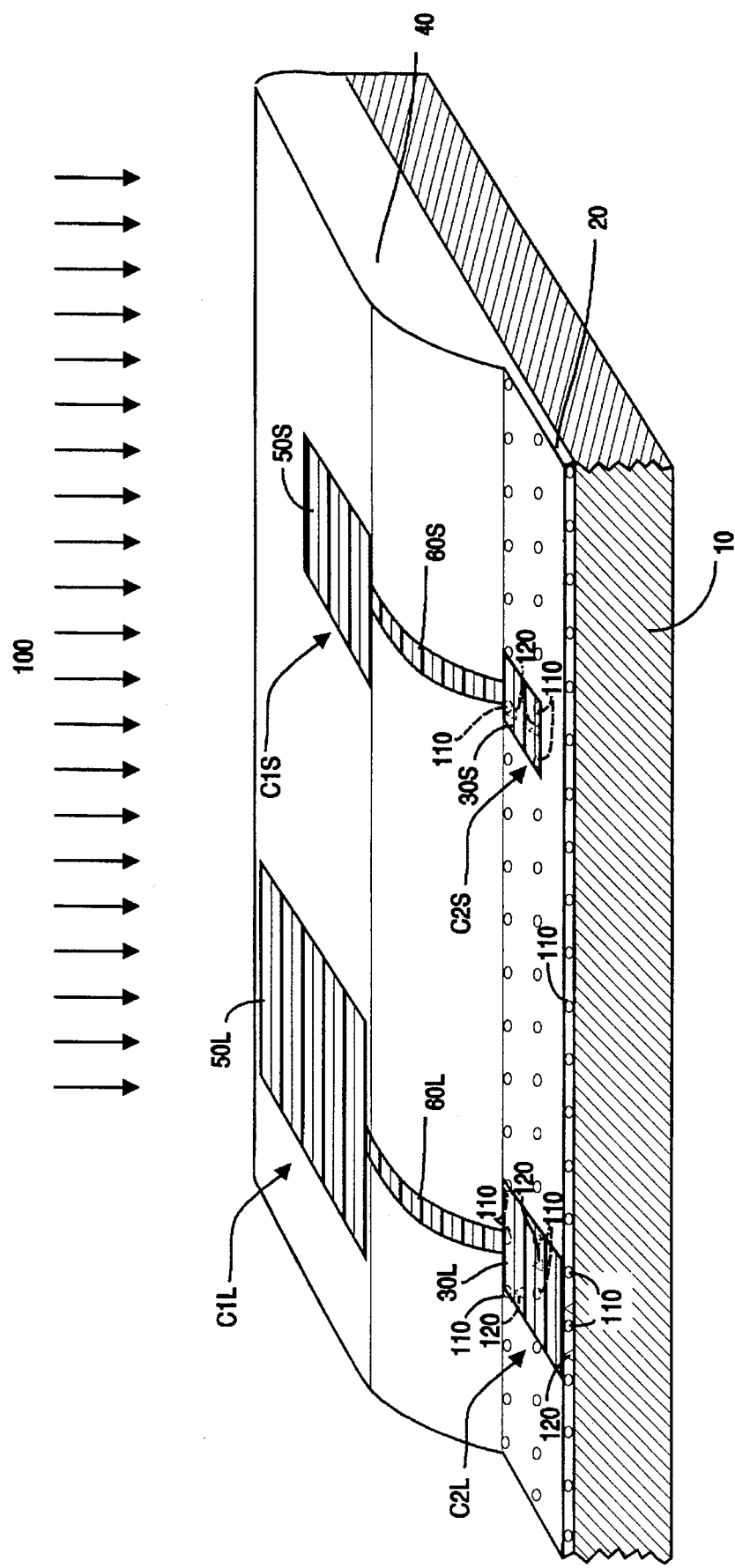
FIG. 2 depicts a differential antenna structure for testing thin oxide and discerning between weak oxide and charge-damaged oxide, according to the present invention.

FIG. 2 depicts a preferred embodiment of the present invention wherein at least one pair of antenna structures are fabricated on an IC wafer. In several regards, FIG. 2 is similar to FIG. 1, and similar element reference numerals are used to refer to similar elements. Thus, in FIG. 2, the IC is formed from a wafer on a semiconductor substrate 10 that includes a thin layer of oxide 20, as well as a region of thick field oxide 40. As noted, thickness of thin oxide 20 is typically in the range of a few hundred angstrom or less, whereas thickness of the field oxide 40 may be in the range of several thousand angstrom, or more. Those skilled in the art will recognize that thin oxide 20 may be used as gate oxide in the formation of MOS devices on the wafer, or as a dielectric oxide in the formation of capacitors on the wafer.

The first antenna structure includes a conductive region 30L having area $A_{C2L}$ that overlies a region of thin oxide 20, a conductive region 50L having area $A_{C1L}$ that overlies a region of thick field oxide 40, and a conductive segment 60L coupling region 30L to region 50L. The ratio $A_{C1L}/A_{C2L}$ defines an antenna ratio $A_R$. Regions 30L, 50L and segment 60L are formed of conductive polysilicon during normal formation of the gate layer of the IC. In the preferred embodiment, regions 30L, 50L and segment 60L are formed from conductive polycide, e.g., tungsten silicide atop polysilicon.

Conductive region 50L, the underlying portion of thick oxide 40, and an underlying portion of the bottom of substrate 10 collectively define a capacitor C1L. Similarly, conductive region 30L, the underlying portion of thin oxide 20, and an underlying portion of the bottom of substrate 10 collectively define a capacitor C2L.

Generally the area of plate 50L is substantially larger than the area of plate 30L, and the plate separation for capacitor C2L (e.g., the thickness of dielectric layer 20) is less than the plate separation of capacitor C1L (e.g., the thickness of dielectric layer 40). As a result, much of the charge collected by capacitor C1L will remain over the thick field oxide layer 40. However, any charge present at capacitor C2L will have a greater impact due to the thinness of the underlying thin oxide layer 20. Further, as noted, any leakage across C2L will result in charge transferring from capacitor C1L to C2L.

It is appreciated from FIG. 2 that because segment 60L couples the upper "plates" or conductive regions 30L and 50L, capacitor C2L is coupled in parallel with capacitor C1L. In the present invention, C1L, C2L, C1S and C2S are used only for testing, and thus need not be electrically coupled to the remainder of the IC.

Similarly, the second antenna structure includes a conductive region 30S having area $A_{C2S}$ that overlies a region of thin oxide 20, a conductive region 50S having area $A_{C1S}$ that overlies a region of thick field oxide 40, and a conductive segment 60S coupling region 30S to region 50S. The ratio $A_{C1S}/A_{C2S}$ defines the same antenna ratio $A_R$ that is defined by the first antenna structure. Regions 30S, 50S and segment 60S preferably are formed of polycide during normal formation of the polysilicon 1 layer of the IC, but may be polysilicon instead.

Conductive region 50S, the underlying portion of thick oxide 40, and an underlying portion of the bottom of substrate 10 collectively define a capacitor C1S. Similarly, conductive region 30S, the underlying portion of thin oxide 20, and an underlying portion of the bottom of substrate 10 collectively define a capacitor C2S. Similar to what was described above, segment 60S couples the upper "plates" or conductive regions 30S and 50S, causing capacitor C2S to be coupled in parallel with capacitor C1S. Charge present across capacitor C2S can have a substantial effect upon the underlying oxide layer 20, due to the thinness of this layer. Further, any leakage across the thin oxide layer 20 will result in the transfer of charge from capacitor C1S to capacitor C2S.

As shown in FIG. 2, conductive regions 30L and 30S will overlie portions of any weak oxide defects, again shown as circles 110, in thin oxide layer 20. Note that the area $A_{C2L}$ of plate 30L is larger than the area $A_{C2S}$ of plate 30S. As a result, the larger conductive plate region 30L will tend to overlie more weak oxide defects than will the smaller conductive plate region 30S, as depicted in FIG. 2.

If desired, a source and drain region may be defined on either side of plate regions 30L, 30S to define test MOS devices, whose gates are plate regions 30L, 30S and whose gate oxide is the underlying portion of thin oxide layer 20. The characteristics of these two MOS devices may be probed to discern the nature of any defects in the gate oxide, which is to say in thin oxide layer 20.

According to the present invention, the IC is fabricated and then tested for oxide defects on a per-wafer basis, before packaging. If testing indicates no oxide defects, or charge-damaged oxide, the IC may be cut into dies and packaged. If testing indicates weak oxide, no packaging should occur, and the wafer should be discarded. With respect to further fabrication, an overlying metal 1 region may be added, as well as an inter-metal-oxide layer, and perhaps an overlying metal 2 region, and so on. These additional process steps are not depicted in FIG. 2.

However, many of these fabrication steps may involve charged energetic species that can cause substantial charge to be collected in the conductive "plate" regions 50L and 30L. However, any charge appearing across capacitors C2L and C2S can give rise to charge-damage 120 (shown as triangles) in the underlying thin oxide 20.

According to the present invention the ratio $A_{C1L}/A_{C2L}$ and the ratio $A_{C1S}/A_{C2S}$ are substantially equal to the same $A_W$, e.g., equal within a tolerance of perhaps 10% to 20% or better. For example, if the common ratio $A_W$ is, say, 9,880:1 and the area $A_{C2L}$ of plate 30L is 2.5 $\eta m^2$, the area $A_{C1L}$ of plate 50L would be 22,222 $\mu m^2$, and the area $A_{C1S}$ of plate 50S might be 494,400 $\mu m^2$ and the area $A_{C2S}$ of plate 30S would be 55.5 $\mu m^2$. Of course other ratios and relative areas could be used, provided that $$A_R \approx A_{C1L}/A_{C2L} \approx A_{C1S}/A_{C2S}.$$

Because these ratios are substantially equal, the charge density upon "plate" 30L of capacitor C2L will be substantially equal to the charge density upon "plate" 30S of capacitor C2S. Thus, the density of charge-damage 120 underlying "plates" 30L and 30S will be substantially the same, and will be independent of the respective area of these plates. This is depicted in FIG. 2, by a substantially equal number of charge-defects 120 underlying plate 30L and plate 30S.

As noted, during fabrication, plates 50L and 50S may be subjected to energetic species, shown as 100. For example, during a plasma etching fabrication step, a voltage V may be induced across capacitors C1L and C2L, as well as across capacitors C1S and C2S. Because it is larger, plate 50L will collect charge Q1 that is larger in magnitude than the charge Q3 collected by the smaller plate 50S. However, any charge collected at plate 30L can have a substantial effect on the underlying thin oxide layer 20. The following equations are applicable:

$$Q1/C1L=V=Q2/C2L$$

$$Q3/C1S=V=Q4/C2S$$

where Q2 is the charge at plate 30L (where Q1>Q2), and where Q4 is the charge transferred to plate 30S (where Q3>Q4).

Although the charge Q1 collected by plate 50L exceeds the charge Q3 collected by plate 50S, charge density across capacitors C2L and C2S will be substantially constant. This constant charge density results because the area of plate 30L is proportionally larger than the area of plate 30S because the antenna ratio $A_R$ is substantially constant for both antenna structures.

At least a portion of the charge produced by the plasma etching 100 (or the like) will be transferred to plates 30L and 30S. Underlying plates 30L and 30S, the thin oxide 20 will be thinner in regions of defective oxide and/or charge-damaged oxide. Because oxide layer 20 is thinner in the defective regions, these regions have larger associated localized capacitances than do the other regions of oxide layer 20 having a greater nominal thickness. Thus, within the thin oxide layer 20, charge density is highest at the thinnest, e.g., defect-containing, regions. It is these defective regions that will tend to break down due to the charge present in plates 30L and 30S.

Figure 3A:
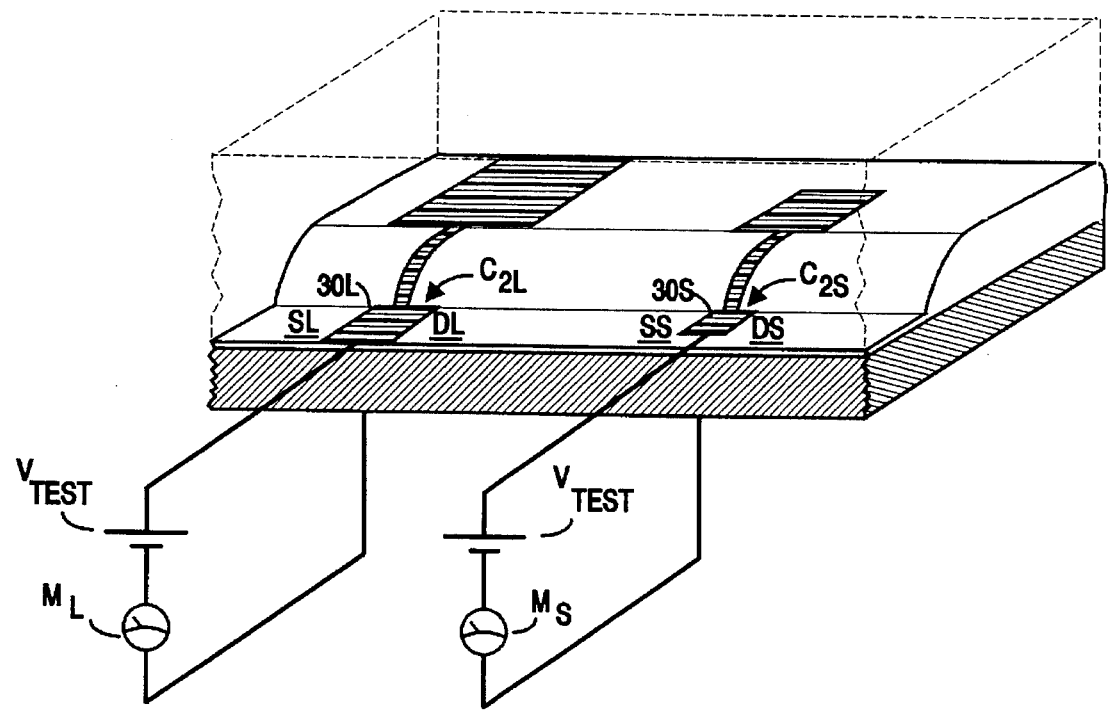
FIG. 3A depicts differential antenna test identification of good thin oxide, according to the present invention.

FIG. 3A depicts defect testing, using differential antenna structures, according to the present invention.

As suggested by the phantom lines, the IC wafer containing the antenna structures has undergone further fabrication steps (not shown), some of which may involve charged energetic species.

For ease of illustration, electrical connection of a test voltage, $V_{TEST}$, is shown as being made directly to plates 30L and 30S. It is understood, however, that such connections may in fact be made at the upper surface of the IC wafer using vias that are in electrical contact with plates 30L and 30S. Typically $V_{TEST}$ will have a magnitude perhaps 10% greater than the nominal design voltage for the IC. Thus, if MOSFETs on the IC are nominally 5 V devices, $V_{TEST}$ will be about 5.5 VDC. Of course, other voltage magnitudes may also be used. Of course, instead of being a DC source, $V_{TEST}$ could instead be a ramped voltage signal.

It is also understood that if source and drain regions (e.g., $S_L$, $D_L$, $S_S$, $D_S$) were formed adjacent plates 30L, 30S, oxide testing may be accomplished by examining the characteristics of the resulting MOS devices. Such characteristic testing would not of course be limited to gate leakage current, but could include parameters measured from source to drain, gate to source, gate to drain, and so forth. While MOS device characteristics are useful in oxide testing, simply testing for leakage current (or MOS device gate leakage current) presents a simpler form of analysis.

A current measuring device, shown as current meter $M_L$ or $M_S$ is coupled in series with $V_{TEST}$, and the electrical circuit is completed by making contact to the lower surface of the substrate. So connected, a voltage $V_{TEST}$ is coupled across each of capacitors C2L and C2S, whose dielectric is the thin oxide layer. If the thin oxide layer is defect free, capacitors C2L and C2S should conduct zero current. However, if defects are present, $V_{TEST}$ may produce a current, perhaps by Fowler-Nordheim tunnelling, that can be measured by current meters $M_L$ and/or $M_S$. Typically, any leakage current to be measured will stabilize within a matter of milliseconds, which permits rapid thin oxide testing on a per wafer-basis.

Generally, if leakage current through capacitor C2L or C2S exceeds some nominal threshold value, e.g., 1 nA, the thin oxide will be regarded as defective. Similarly, if test MOS devices were formed having regions 30L and 30S as gates, nominal MOS device characteristics may be established to define acceptable gate oxide. In FIG. 3A, both current meters $M_L$ and $M_S$ indicate essentially no leakage current, or leakage current below the nominal threshold value. Thus, for the wafer under test in FIG. 3A, the thin oxide is accepted as being good, e.g., substantially free of defects. The quality of the thin oxide in FIG. 3A is depicted symbolically by the substantial lack of "circles" or "triangles".

Figure 3B:
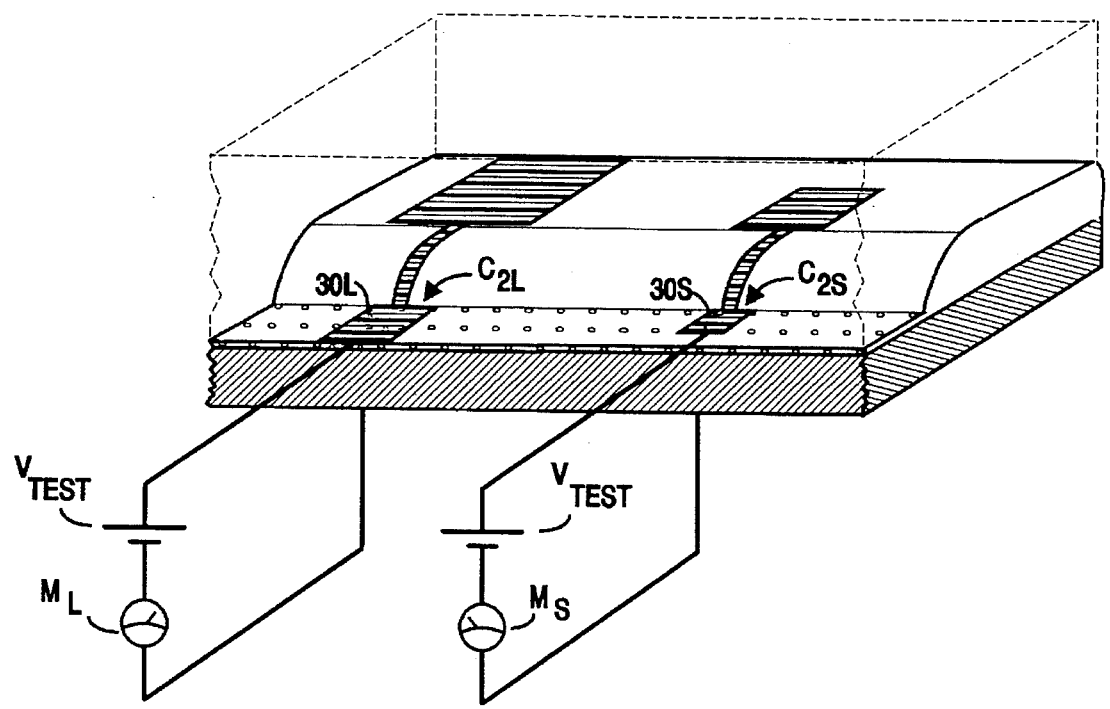
FIG. 3B depicts differential antenna test identification of weak thin oxide, according to the present invention.

However, for the wafer under test in FIG. 3B, current meter $M_L$ measures excessive leakage current through capacitor $C_{2L}$. By contrast, meter $M_S$ measures essentially no leakage current, or leakage current below the nominal threshold. It is seen in FIG. 3B that plate 30L for capacitor $C_{2L}$ has larger area than has plate 30S for $C_{2S}$. Because the excessive leakage current is associated with capacitor $C_{2L}$, the defect-cause of the leakage current must be area dependent. Since weak oxide defects are area dependent, whereas charge-damaged oxide defects are not, the wafer under test in FIG. 3B is identified as having weak oxide. The wafer should be rejected. Further, the fab should be reexamined with respect to eliminating or reducing the contamination that resulted in the production of weak oxide. Again, it is to be understood that if MOS devices were formed having plates 30L, 30S as gates, examination of the characteristics of these MOS devices could identify the gate oxide as being weak oxide.

Figure 3C:
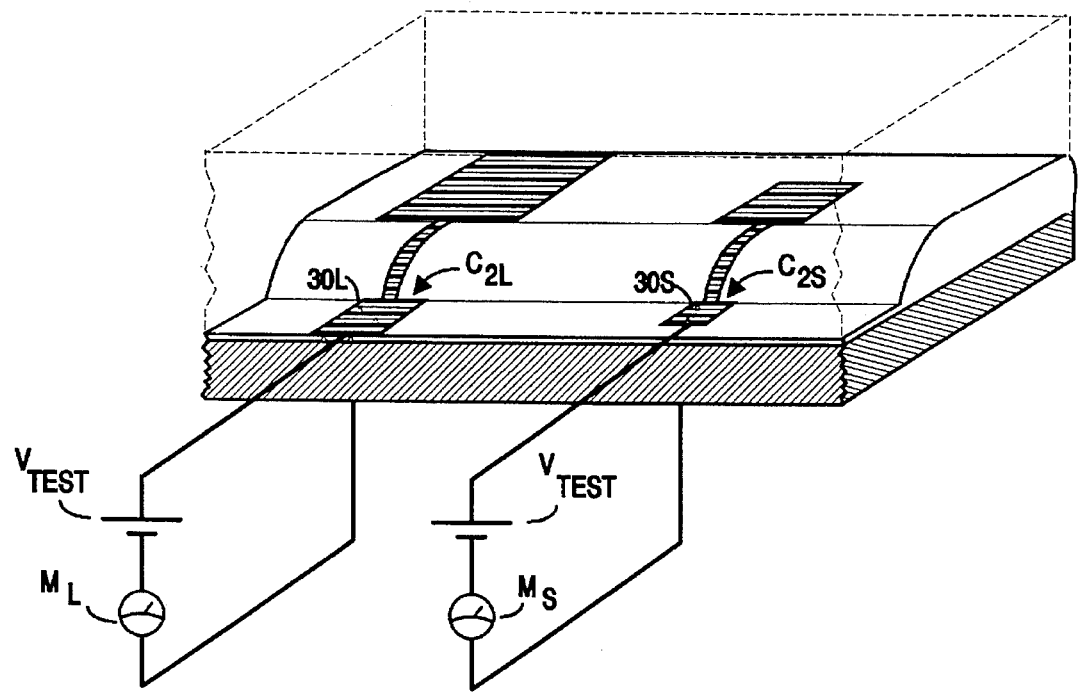
FIG. 3C depicts differential antenna test identification of charge-damage thin oxide, according to the present invention.

Consider now the wafer under test in FIG. 3C. Both current meters $M_L$ and $M_S$ depict excessive leakage current, e.g., current exceeding the nominal threshold value. Because the defect-cause of the high leakage currents does not appear to be dependent upon the area of plates 30L or 30S, charge-damaged oxide is indicated. As noted, even though plates 30L and 30S have different areas, each plate experiences the same charge density because $A_R$ is substantially constant for each antenna structure. Although the wafer under test has charge-damaged oxide, it may still be used provided that antenna-like structures including long leads are not present on the IC. Were such structures present, they could be subject to electric fields that would result in charge-damaged thin oxide in the IC. Further, it is now known that the fab should be reexamined with respect to correcting sources of plasma imbalance, and the like. The charge-damaged condition of the thin oxide in FIG. 3C is depicted symbolically by the substantial lack of "circles" but by the presence of "triangles" generally underlying plates 30L, 30S. Although less straightforward that leakage current measurement, characteristics of any MOS devices formed having plates 30L, 30S as gates could also identify the nature of gate oxide defects.

It will be appreciated that the testing shown in FIGS. 3A, 3B and 3C may be carried out at the wafer level, before IC packaging occurs. Thus, while the wafers tested in FIG. 3A and 3C will be separated into individual dies and packaged, the time and expense of packaging will not be incurred for the weak-oxide containing wafer under test in FIG. 3B.

Note that whereas prior art HTOL testing is done on sample lots using dedicated printed circuit boards, differential antenna testing according to the present invention may be carried out on a per-wafer basis without using test equipment that is dedicated to the type of circuitry on the wafer. Whereas HTOL testing can require weeks, differential testing according to the present invention typically requires a few minutes per wafer, and may be carried out with inexpensive equipment that is used to test all types of wafers.

In prior art HTOL testing, the stressed products are not saleable, whereas differential testing according to the present invention is carried out on test antenna structures. According to the present invention, good wafers as well as wafers containing charge-damaged oxide will be identified and cut into dies that are then packaged and sold. In contrast to the inability of prior art HTOL testing to provide real-time screening of outgoing products, differential testing according to the present invention may be performed in real-time on every single wafer in every lot. Finally, any analysis results from HTOL testing will come weeks after the fabrication run in question, whereas differential testing according to the present invention can occur sufficiently rapidly to allow meaningful corrections to be made in the fab to correct the cause of the defects.

Figure 4:
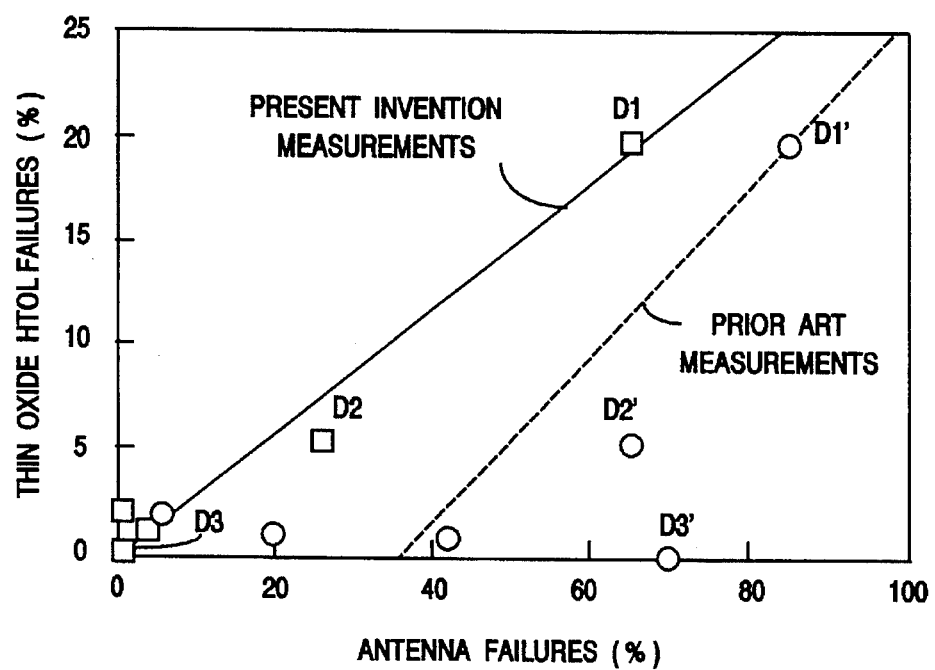
FIG. 4 depicts data showing proper identification of weak oxide and charge-damaged oxide according to the present invention, as contrasted with incorrect identification according to the prior art.

FIG. 4 further demonstrates the ability of the present invention to unambiguously identify a wafer containing charge-damaged oxide. By contrast, prior art HTOL testing would result in the same wafer being discarded, as unusable. Identical wafers were tested, using differential antenna structures according to the present invention, and using a single antenna structure and conventional HTOL testing, according to the prior art. In FIG. 4, the "squares" are leakage current data points collected using the present invention, whereas the "circles" are leakage current data points collected using a single antenna structure and prior art HTOL testing.

As shown in FIG. 4, the "squares" more or less fall along a straight solid line, approximated by 0.964+3.27* (differential antenna structure data). These data have a measure of goodness $R^2=0.973$ (where $R^2=1$ would denote perfect linearity, and absolutely unambiguous data). The "circles", however, do not fall close to the dashed line, approximated by 36.0+2.47* (prior art single antenna structure data). The measure of goodness is $R^2=0.379$, which indicates that the data gathered according to the prior art are not especially linear, e.g., not especially unambiguous.

Compare, for example, data point D1' (obtained according to the prior art), and data point D1 (obtained using the present invention). Data point D1' reflects that some 80⁺% of the prior art antenna structures are failing, e.g., report excessively large leakage current. Thus, although the prior art can determine that the thin oxide is defective, it is unknown whether the oxide is weak oxide and thus not usable, or whether the oxide is charge-damaged, and thus still usable (providing no antenna-like structures overlie the thin oxide). The prior art has no alternative but to discard the wafer under test.

By contrast, data point D1 lies on the solid line, which is characterized by a high measure of goodness $R^2$. As such, it is reasonably certain that the wafer under test is defective due to weak oxide, and should be discarded. Further, it is now known that the fab should be examined with regard to identifying possible sources that gave rise to the weak oxide. Consider now data points D2' and D2. Data point D2' is indicative of a high antenna failure rate (e.g., perhaps 65%). But because of the poor associated measured of goodness, it is unknown whether the antennas have failed due to weak oxide, or due to charge-damaged oxide but not weak oxide.

By contrast, data point D2 suggests that the identical wafer is perhaps not as defective as prior art data point D2' indicates. However, because D2 is relatively close to the solid line, which is characterized by a high measure of goodness, it is reasonably certain that the oxide in question is weak oxide, and that the wafer should be discarded.

The most significant difference between prior art measurements and measurements according to the present invention is apparent from consideration of data points D3' and D3. Data point D3' suggests that 70% of the antenna structures have failed, and thus the oxide in question is defective, although it is again unknown whether the defects are due to weak oxide or due to charge-damaged oxide. The conclusion drawn, then, from prior art measurement is that the wafer under test is very defective.

By contrast, however, data point D3 falls on the solid line near the origin, and strongly indicates that the defective oxide is charge-damaged. Thus, prior art measurements giving rise to data point D3' would result in the false conclusion that the wafer under test has defective oxide. However, differential antenna measurement according to the present invention correctly reflects that the identical wafer has charge-damaged oxide but not weak oxide. It is now known that the wafer may still be used (again, providing no overlying antenna-like structures are present).

In conclusion, differential measurements using common $A_R$ antenna pairs having differently sized plates can permit rapid identification of defective thin oxide, as well as a determination whether the defects are weak oxide or charge-damaged oxide. These measurements may be rapidly carried out on a per-wafer basis using standardized test equipment. Even if the IC-containing wafers were not subjected to field-induced charge during fabrication, the present invention still permits identification of area-dependent weak oxide.

Modifications and variations may be made to the disclosed embodiments without departing from the subject and spirit of the invention as defined by the following claims. For example, although the preferred embodiment has been described with respect to a pair of antenna structures, three or more structures may be fabricated, each having the same $A_R$ ratio, and each having plates of differing area. It is also understood that the plates need not be rectangular as shown, and may have other shapes including, for example, interdigitated comb-like shapes.

What is claimed is:

1. A method of examining a semiconductor wafer that includes a substrate, at least a region of thin oxide, and at least a region of thick field oxide and determining whether any defects in the thin oxide are due to weak oxide or are due to charge-damaged oxide, the method comprising the following steps:

(a) fabricating on said wafer first and second conductive regions overlying said thin oxide, the first conductive region defining a greater surface area than the second conductive region;

(b) applying a voltage between said first conductive region and a portion of said substrate, and measuring any first leakage current flow therebetween;

(c) applying a voltage between said second conductive region and a portion of said substrate, and measuring any second leakage current flow therebetween; and (d) comparing said first leakage current and said second leakage current to ascertain a defect status of said thin oxide;

if the first and second leakage currents are each less in magnitude than a predetermined threshold value, said thin oxide is substantially defect free;

if only the first leakage current exceeds said predetermined threshold value, defects in said thin oxide are area-dependent and said thin oxide is weak oxide; and if the first and second leakage currents each exceed said predetermined threshold value, defects in said thin oxide are area-independent and said thin oxide is charge-damaged.

2. The method of claim 1, wherein between step (a) and step (b) there is performed an additional step (a'), comprising:

(a') during at least one subsequent fabrication step, subjecting said first and second conductive regions to field-induced charge, such that charge density is substantially equal at said first and second conductive regions;

3. The method of claim 1, wherein step (a) further includes:

fabricating on said wafer third and fourth conductive regions overlying said thick field oxide and being electrically coupled respectively to said first and second conductive regions, the third conductive region defining a greater surface area than the fourth conductive region;

wherein a first ratio defined by the third conductive region surface area divided by the first conductive region surface area is substantially equal to a second ratio defined by the fourth conductive region surface area divided by the second conductive regions surface area.

4. The method of claim 1, wherein fabrication of the regions at step (a) is carried out at a first polysilicon level of formation.

5. The method of claim 3, wherein at least one of said first, second, third and fourth conductive regions has at least one characteristic selected from the group consisting of (i) the region includes polycide, (ii) the region includes polysilicon, and (iii) the region defines a rectangular surface area.

6. The method of claim 2, wherein step (a') includes steps forming an integrated circuit on said wafer.

7. The method of claim 6, wherein steps (b), (c) and (d) are carried out before packaging of said integrated circuit.

8. The method of claim 1, wherein steps (b) and (c) include applying voltage whose magnitude is at least a desired operating voltage of a device on said wafer that includes said thin oxide.

9. A method of examining a semiconductor wafer that includes a substrate, at least a region of thin oxide, and at least a region of thick field oxide and determining whether any defects in the thin oxide are due to weak oxide or are due to charge-damaged oxide, the method comprising the following steps:

(a) fabricating on said wafer parallel-coupled first and second capacitors, and parallel-coupled third and fourth capacitors;

said first and third capacitors each comprising a conductive plate region overlying respective portions of said thick field oxide, and further comprising an underlying portion of said substrate, wherein first and third portions of intervening said thick field oxide define a dielectric for said first and third capacitors;

said second and fourth capacitors each comprising a conductive plate region overlying respective portions said thin oxide, and further comprising an underlying portion of said substrate, wherein second and fourth portions of intervening said thin oxide define a dielectric for said second and fourth capacitors;

said conductive plate regions of the first and second capacitors defining larger surface areas than are defined by the conductive plate regions of the third and fourth capacitors;

a first ratio being defined by the surface area of the conductive region of the first capacitor overlying said thick field oxide divided by the surface area of the conductive region of the second capacitor overlying said thin oxide; and a second ratio, substantially equal to said first ratio, being defined by the surface area of the conductive region of the third capacitor overlying said thick field oxide divided by the surface area of the conductive region the fourth capacitor overlying said thin oxide;

(b) applying a voltage across said second capacitor and measuring any second leakage current flow therebetween;

(c) applying a voltage across said fourth capacitor and measuring any fourth leakage current flow therebetween; and (d) comparing said second leakage current and said fourth leakage current to ascertain a defect status of said thin oxide;

if the second and fourth leakage currents are each less in magnitude than a predetermined threshold value, said thin oxide is substantially defect free;

if only the second leakage current exceeds said predetermined threshold value, defects in said thin oxide are area-dependent and said thin oxide is weak oxide; and if the second and fourth leakage currents each exceed said predetermined threshold value, defects in said thin oxide are area-independent and said thin oxide is charge-damaged.

10. The method of claim 9, wherein between step (a) and step (b) there is performed an additional step (a'), comprising:

(a') during at least one subsequent fabrication step, subjecting at least said first and third capacitors to field-induced charge, such that charge density is substantially equal at said second and fourth capacitors; first and second conductive regions.

11. The method of claim 9, wherein fabrication of the regions at step (a) is carried out at a first polysilicon level of formation.

12. The method of claim 10, wherein at step (a'), wherein at least one of said first, second, third and fourth capacitors has at least one characteristic selected from the group consisting of (i) the capacitor includes a plate region comprising polycide, (ii) the capacitor includes a plate region comprising polysilicon, and (iii) the capacitor includes a plate region that defines a rectangular surface area.

13. The method of claim 10, wherein step (a') includes steps forming an integrated circuit on said wafer.

14. The method of claim 11, wherein steps (b), (c) and (d) are carried out before packaging of said integrated circuit.

15. The method of claim 8, wherein steps (b) and (c) include applying voltage whose magnitude is at least a desired operating voltage of a device on said wafer that includes said thin oxide.

16. A method of examining a semiconductor wafer that includes a substrate, at least a region of thin oxide, and at least a region of thick field oxide and determining whether any defects in the thin oxide are due to weak oxide or are due to charge-damaged oxide, the method comprising the following steps:

(a) fabricating on said wafer first and second conductive gate regions overlying said thin oxide, the first conductive region defining a greater surface area than the second conductive region, and forming adjacent each conductive gate region a source region and a drain region, wherein first and second test MOS devices are formed;

(b) measuring at least one characteristic of each of said first and second test MOS devices to determine quality of said thin oxide;

(c) comparing characteristics measured at step (b) to ascertain a defect status of said thin oxide;

wherein following step (c) a determination is made that said thin oxide is substantially defect free, that said thin oxide is weak oxide, or that said thin oxide is charge-damaged.

17. The method of claim 16, wherein between step (a) and step (b) there is performed an additional step (a'), comprising:

(a') during at least one subsequent fabrication step, causing said first and second conductive regions to receive field-induced charge, such that charge density is substantially equal at said first and second conductive gate regions;

18. The method of claim 16, wherein step (a) further includes:

fabricating on said wafer third and fourth conductive regions overlying said thick field oxide and being electrically coupled respectively to said first and second conductive gate regions, the third conductive region defining a greater surface area than the fourth conductive region;

wherein a first ratio defined by the third conductive region surface area divided by the first conductive region surface area is substantially equal to a second ratio defined by the fourth conductive region surface area divided by the second conductive regions surface area.

19. For fabrication with a semiconductor wafer that includes a substrate, at least a region of thin oxide, and at least a region of thick field oxide, said wafer being subjected to charged energetic species during fabrication of an integrated circuit thereon, a differential antenna structure used to determine whether any defects in the thin oxide are due to weak oxide or are due to charge-damaged oxide, the structure comprising:

- first and second conductive regions defining respective first and second surface areas, fabricated on said wafer overlying said thin oxide;
- third and fourth conductive regions defining respective third and fourth surface areas, fabricated on said wafer overlying said thick field oxide;
- wherein a first ratio is defined by surface area of the third conductive region divided by surface area of the first conductive region, and a second ratio substantially equal to said first ratio is defined by surface area of the fourth conductive region divided by surface area of the second conductive region;
- a first conducting element electrically coupling together the first and third conductive regions;
- a second conducting element electrically coupling together the second and fourth conductive regions;
- wherein after fabrication of said integrated circuit, measurement is made of any first leakage current between the first conductive region and said substrate in response to a voltage applied thereacross, and measurement is made of any second leakage current between the second conductive region and said substrate in response to a voltage applied thereacross, these measurements providing identification of defects in said thin oxide;
- if the first and second leakage currents are each less in magnitude than a predetermined threshold value, said thin oxide is substantially defect free;
- if only the first leakage current exceeds said predetermined threshold value, defects in said thin oxide are area-dependent and said thin oxide is weak oxide; and
- if the first and second leakage currents each exceed said predetermined threshold value, defects in said thin oxide are area-independent and said thin oxide is charge-damaged.

20. The structure of claim 19, wherein said conducting regions and said conducting elements include polysilicon formed during fabrication of a first polysilicon level associated with said integrated circuit.

* * * * *